United States Patent [19]

Izumi et al.

[11] Patent Number: 5,242,846
[45] Date of Patent: Sep. 7, 1993

[54] METHOD OF MANUFACTURING A JUNCTION FIELD EFFECT TRANSISTOR

[75] Inventors: Sigekazu Izumi; Kohki Nagahara, both of Itami, Japan

[73] Assignee: Mitsubishi Denki Kabushiki Kaisha, Tokyo, Japan

[21] Appl. No.: 928,028

[22] Filed: Aug. 11, 1992

Related U.S. Application Data

[62] Division of Ser. No. 602,804, Oct. 24, 1990, Pat. No. 5,159,414.

[30] Foreign Application Priority Data

Oct. 30, 1989 [JP] Japan .................. 1-283872

[51] Int. Cl.$^5$ .......................... H01L 21/338
[52] U.S. Cl. ...................... 437/40; 437/133; 437/911
[58] Field of Search .......... 437/911, 40, 133; 257/134, 256, 264

[56] References Cited

U.S. PATENT DOCUMENTS

| 4,593,301 | 6/1986 | Inata et al. | 357/22 |
| 4,714,948 | 12/1987 | Mimura et al. | |
| 4,734,750 | 3/1988 | Okamura et al. | 357/16 |
| 4,746,627 | 5/1988 | Zuleeg | 437/126 |

FOREIGN PATENT DOCUMENTS

| 0268426 | 5/1988 | European Pat. Off. . | |
| 56-110269 | 9/1981 | Japan . | |
| 56-126977 | 10/1981 | Japan . | |
| 57-112079 | 7/1982 | Japan . | |
| 63-133679 | 6/1986 | Japan . | |
| 61-17071 | 7/1986 | Japan . | |
| 2-43742 | 2/1990 | Japan | 437/133 |
| 2-98944 | 4/1990 | Japan | 437/133 |

OTHER PUBLICATIONS

Mishra, V., et al., "Novel High Performance..", IEEE IEDM Tech. Dig. 1989, pp. 101–104.
Akinwande, A., "Towards VLSI GaAs...", IEEE IEDM Tech. Dig. 1989, pp. 97–100.
Tang, J., et al., "GaAs Gate...", IBM Tech. Disclosure Bulletin, vol. 27, No. 9, Feb. 1985, pp. 5064–5066.
Kasahara, J., et al., "Fully Ion Implanted...", Electronics Letters, Aug. 20, 1981, vol. 17, No. 17, pp. 622–623.

Primary Examiner—T. N. Quach
Attorney, Agent, or Firm—Leydig, Voit & Mayer

[57] ABSTRACT

A method of making a junction field effect transistor includes sequentially growing a first conductivity type semiconductor layer and a relatively high resistivity semiconductor layer on a relatively high resistivity semiconductor substrate; forming spaced apart relatively low resistivity first conductivity type source and drain regions in the relatively high resistivity and first conductivity type semiconductor layers; forming a second conductivity type gate region in the high resistivity semiconductor layer spaced from the source and drain regions and extending to and forming a rectifying junction with the first conductivity type semiconductor layer; and forming source, gate, and drain electrodes in contact with the source, gate, and drain regions, respectively.

14 Claims, 5 Drawing Sheets

METHOD OF MANUFACTURING A JUNCTION FIELD EFFECT TRANSISTOR

This application is a division of application Ser. No. 07/602,804, filed Oct. 24, 1990 U.S. Pat. No. 5,159,414.

FIELD OF THE INVENTION

The present invention relates to junction field effect transistors employing a pn junction gate (referred to as JFETs) and particularly to JFETs made of a compound semiconductor, such as gallium arsenide.

BACKGROUND OF THE INVENTION

Figure 1:
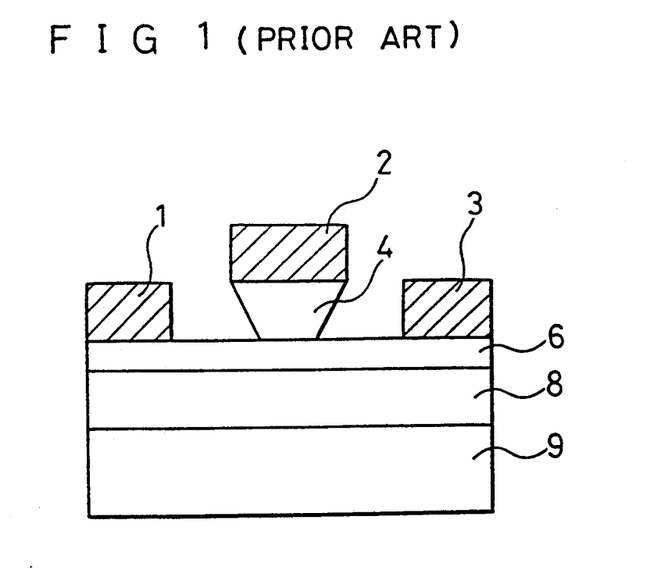
FIG. 1 is a sectional view of the structure of a prior art junction field effect transistor including a mesa formed by etching.

FIG. 1 is cross-sectional view schematically showing the structure of a conventional junction field effect transistor. The transistor includes a metal source electrode 1, a metal gate electrode 2, and a metal drain electrode 3. The gate electrode 2 is disposed on a gate region 4 which is a residual portion of a p-type layer 4. Source and drain electrodes 1 and 3 are disposed on an n-type channel layer 6 and form ohmic contacts with that channel layer. Gate region 4 is disposed on channel layer 6 between the source and drain electrodes 1 and 3 and forms a rectifying junction with layer 6. Typically, channel layer 6 is disposed on a buffer layer 8 that is undoped. The entire structure is disposed on a substrate 9, for example, a semi-insulating gallium arsenide substrate when the other materials employed in the JFET are gallium arsenide or aluminum gallium arsenide. The gate region 4 is formed by etching a semiconductor layer that is epitaxially grown, for example, by molecular beam epitaxy (MBE), on channel layer 6. The area of the junction formed between gate region 4 and channel layer 6 is controlled by the amount of etching of the epitaxial layer.

The performance characteristics, particularly the frequency response, of the JFET shown in FIG. 1 is controlled by the area of the junction between gate region 4 and channel layer 6. The cutoff frequency $f_T$ of the JFET when used in an amplifier or the maximum oscillation frequency $f_{max}$ when the JFET is used in an oscillator are typically better than the cutoff and oscillation frequencies of JFETs formed by ion implantation, as described below. However, control of the etching step forming the junction between gate region 4 and channel layer 6 is difficult so that characteristics of devices intended to be identical but manufactured at different times can be significantly different.

Figure 2:
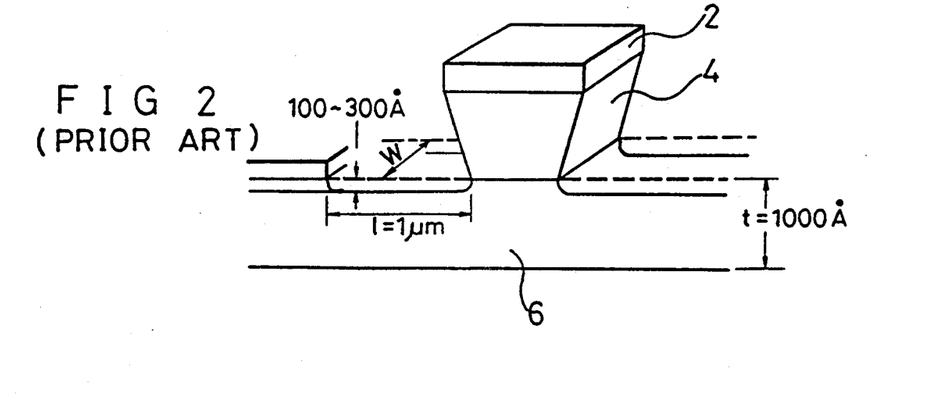
FIG. 2 is a sectional detail view of a portion of the junction field effect transistor of FIG. 1.

The variability of the characteristics of JFETs having the structure shown in FIG. 1 is illustrated with the aid of the partial, schematic view of FIG. 2. As illustrated in FIG. 2, a channel layer 6 has a width W of 200 microns and the distance 1 between the gate region 4 and the source electrode 1 is one micron. In order to ensure that all of the p-type layer between the source and drain electrodes, except gate region 4, is removed in an etching step, the n-type channel layer 6 is etched and partially removed in the vicinity of the gate region 4. In FIG. 2, the interface between the channel layer 6 and the gate layer 4 before etching is indicated by broken lines and the solid lines indicate the channel layer 6 after etching. Typically, the excessive etching removes 100 to 300 Angstroms of the channel layer. Therefore, the thickness t of the channel varies from approximately 1,000 Angstroms near the source and drain electrodes to as little as 700 Angstroms on opposite sides of the gate region 4. The carrier concentration n of electrons in the channel layer 6 is typically about $1.5 \times 10^{17}$ cm$^{-3}$ and the electron mobility $\mu_e$ is about 4,000 cm$^2$/(V s). The source resistance R is:

$$R = (\rho/t)(1/W)$$

where $\rho$ is the resistivity of the material and equals $(1/qn\mu_e)$ and q, the electronic charge, is $1.601 \times 10^{-19}$ C. For the typical carrier concentration and mobility, $\rho$ equals $1.041 \times 10^{-2}$ ohm-cm.

When the channel thickness t is a constant 1,000 Angstroms, the source resistance R is 5.2 ohms. However, if the thickness t of the channel is only about 700 Angstroms because of 300 Angstroms of etching into the channel layer, then the source resistance R increases to 7.5 ohms. This change represents a variation of about 44 percent, depending upon the depth of etching of the channel layer. In practical experience, however, the source resistance varies by much more, for example, approximately 100 percent, amongst etched JFETs made by the same process but at different times.

Figure 3:
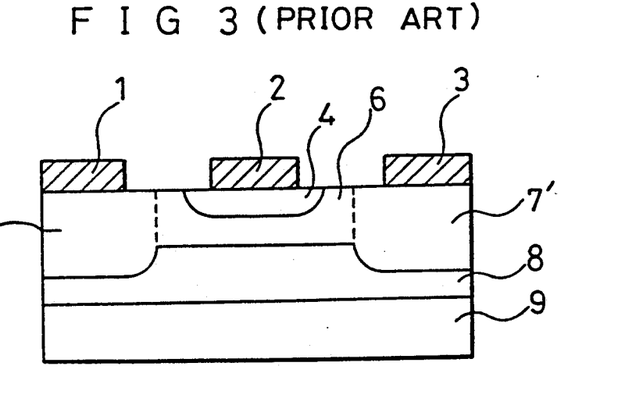
FIG. 3 is a sectional view of the structure of a prior art junction field effect transistor.

FIG. 3 is a sectional schematic view of the structure of a conventional junction field effect transistor made by ion implantation in a method very similar to that used conventionally for making Schottky barrier field effect transistors in gallium arsenide. In FIG. 3, as in the other figures, the same elements previously described are given the same reference numbers. In the structure shown in FIG. 3, the p-type gate region 4 is disposed within n-type channel layer 6 and lies at a surface where the gate electrode 2 is disposed. The structure of FIG. 3 includes relatively heavily doped n+ similar or identical source and drain regions 7 and 7' lying below the source and drain electrodes 1 and 3, respectively. In one method of manufacturing this type of JFET, the n-type layer 6 is epitaxially grown or formed by diffusion or ion implantation of impurities. Thereafter, the central portion of the n-type layer 6 is masked against ion implantation and n+ regions 7 and 7' are produced by ion implantation. Finally, p-type gate region 4 is formed by diffusion or ion implantation employing a mask protecting the area outside the gate region from the p-type dopant ions during implantation or diffusion. The resulting JFET device can be more controllably produced than the structure of FIG. 1 because no etching at a pn junction is required. However, the pn junction that is formed has a parasitic capacitance, in addition to the inherent gate capacitance, reducing the frequency performance of the JFET.

The frequency response characteristics of a field effect transistor are frequently expressed as a cutoff frequency $f_T$.

$$f_T = (g_m/2\pi C_{gs})$$

where $g_m$ is the transconductance of the device and $C_{gm}$ is the capacitance between the gate and source.

Figure 4A:
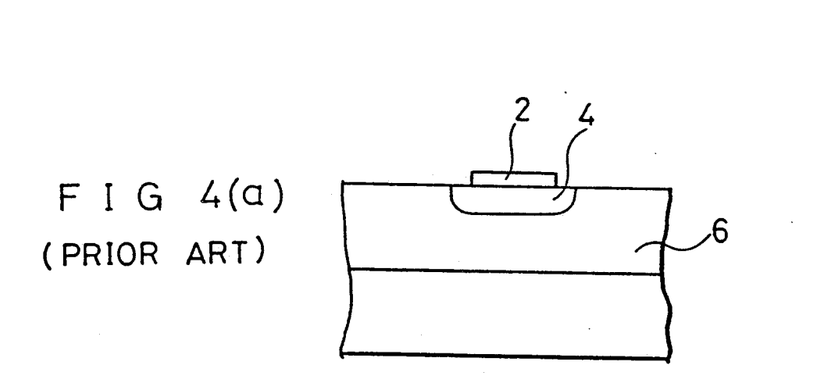
FIGS. 4(a) and 4(b) are sectional detail views of a portion of the junction field effect transistor shown in FIG. 3 including a junction prepared by ion implantation or diffusion.
Figure 4B:
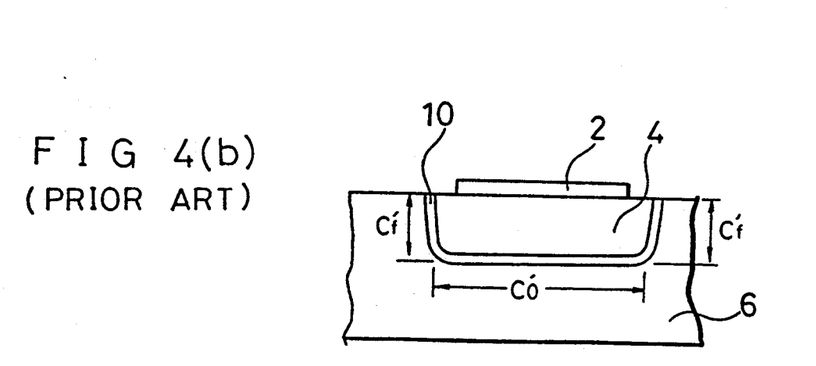

The elements of the parasitic capacitance of the structure of FIG. 3 are illustrated in FIGS. 4(a) and 4(b). FIG. 4(a) shows in cross-section the central portion of the JFET of FIG. 3 including the gate region 4 and gate electrode 2. The junction structure is enlarged in FIG. 4(b) and the depletion layer generated at the junction between the p-type gate region and the n-type channel layer 6 is illustrated. The capacitive components of the depletion layer are $C'_o$ at the deepest part of the junction, parallel to the surface on which the gate electrode 2 is disposed, and $C'_f$ at each of the two sides of the junction that are generally transverse to the surface on which the gate electrode 2 is disposed. These capacitive components are electrically connected in parallel so that the total capacitance is their arithmetic sum, i.e., $C_{gs} = C'_o + 2C'_f$.

Figure 5:
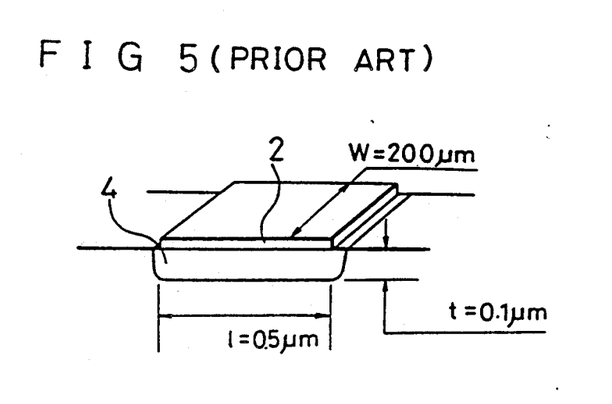
FIG. 5 is a partially sectioned detail view of a portion of the junction field effect transistor of FIG. 3.

A specific example of the capacitance of the JFET of FIG. 3 is illustrated in FIG. 5. In that example, the gate length 1, i.e., the length of the gate region between the source and drain electrodes, is 0.5 micron, the channel width is 200 microns, and the depth t of the gate region is 0.1 micron. The capacitive component at each of the transverse sides of the gate region is about one-fifth of the capacitance at the deepest portion of the gate region based on these dimensions. For a transconductance of 200 mS/mm and a capacitance per unit area of $1.0 \times 10^{-12}$ F/mm, the cutoff frequency $f_T$ of this prior art structure is approximately 30 GHz. This cutoff frequency is much lower than desired. The JFET structure of FIG. 1 has a lower junction capacitance than the structure of FIG. 3 since there are no lateral components of the junction capacitance in the structure of FIG. 1. As a result, a higher cutoff frequency can be achieved with the JFET structure of FIG. 1.

The foregoing description illustrates that, in the prior art, a choice must be made between repeatability, i.e., consistent JFET characteristics, achieved in manufacturing the planar structure of FIG. 3 and extended high frequency performance achieved in the structure of FIG. 1 having a reduced gate capacitance.

SUMMARY OF THE INVENTION

It is an object of the present invention to provide a junction field effect transistor having extended high frequency performance and an planar structure that can be repeatedly manufactured with consistent characteristics.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those of skill in the art from the following detailed description.

According to one aspect of the invention, a junction field effect transistor comprises a semiconductor body having a surface, relatively heavily doped source and drain regions of a first conductivity type disposed in the semiconductor body spaced from each other and reaching the surface, a channel layer of the first conductivity type disposed within the semiconductor body extending between and electrically connecting the source and drain regions, a gate region of a second conductivity type disposed within the semiconductor body extending from the surface to the channel layer and forming a rectifying junction with the channel layer, a relatively high resistivity region disposed within the semiconductor body between the surface and the channel layer, extending between the source and drain regions and surrounding the gate region, and source, gate, and drain electrodes disposed on the surface in contact with the source, gate, and drain regions, respectively.

According to another aspect of the invention, a junction field effect transistor is made by sequentially growing a first conductivity type semiconductor layer and a relatively high resistivity semiconductor layer on a relatively high resistivity semiconductor substrate, forming spaced apart relatively low resistivity first conductivity type source and drain regions in the relatively high resistivity and first conductivity type semiconductor layers, forming a second conductivity type gate region in the high resistivity semiconductor layer spaced from the source and drain regions and extending to and forming a rectifying junction with the first conductivity type semiconductor layer, and forming source, gate, and drain electrodes in contact with the source, gate, and drain regions, respectively.

DETAILED DESCRIPTION OF PREFERRED EMBODIMENTS

Figure 6:
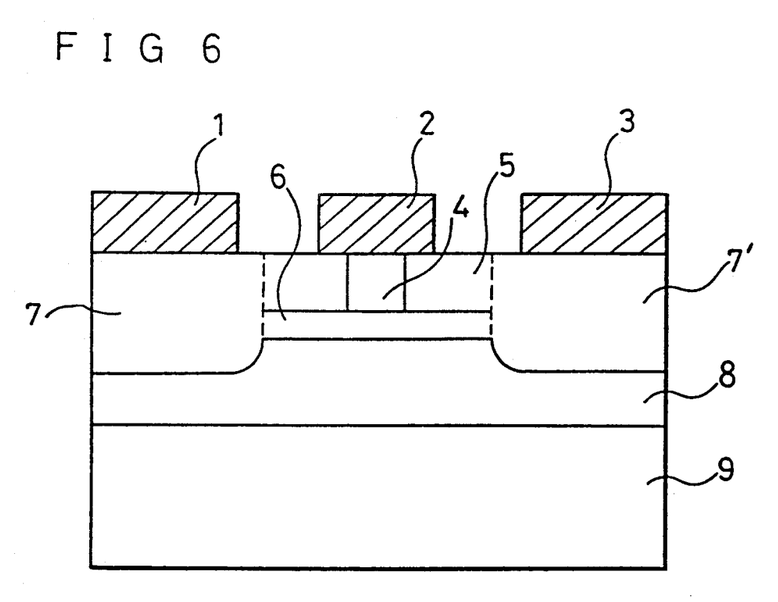
FIG. 6 is a sectional view of the structure of a junction field effect transistor in accordance with an embodiment of the present invention.

A junction field effect transistor according to an embodiment of the invention shown in FIG. 6 includes a semiconductor body comprising a number of elements. A substrate 9, which may be semi-insulating gallium arsenide, has disposed upon it a buffer layer 8 which is preferably undoped gallium arsenide. Buffer layer 8 has a relatively high resistivity and may be or approach intrinsic type, i.e., be free of dopants. On the other hand, the semi-insulating substrate may intentionally include impurities, such as chromium, to produce semi-insulating characteristics.

Generally similar or identical, relatively highly doped n+ source and drain regions 7 and 7' are spaced apart from each other in the semiconductor body and reach a surface of the body opposite substrate 9. A source electrode 1 and a drain electrode 3 are disposed on that surface of the semiconductor body respectively in ohmic contact with the source and drain regions 7 and 7'. An n-type layer 6 is disposed within the semiconductor body spaced from the surface on which the source and drain electrodes are disposed, extending between and electrically connecting the two n+ regions 7 and 7' together. Layer 6 may be gallium arsenide or, in a high electron mobility transistor (HEMT) version of the JFET, may be $Al_xGa_{1-x}As$, where $0 < x \leq 1$. When layer 6 is gallium arsenide, it acts as a current channel through which current flows between the regions 7 and 7'. In an HEMT embodiment, when layer 6 is $Al_xGa_{1-x}As$, a so-called two-dimensional electron gas (2DEG) is formed in buffer layer 8 adjacent and because of the heterojunction of layer 6 and buffer layer 8. Because the mobility of electrons is much higher in the 2DEG than in the $Al_xGa_{1-x}As$, the current flow, i.e., the current channel, between the regions 7 and 7' lies predominantly in the buffer layer. For purposes of identification, layer 6 is designated hereinafter as a channel layer with the understanding that in the HEMT embodiment the channel layer 6 does not function as a current channel.

A p-type gate region 4 extends from the surface on which the source and drain electrodes are disposed to the n-type semiconductor channel layer 6, forming a rectifying junction at the interface of p-type semiconductor gate region 4 and n-type layer 6. A relatively high resistivity, undoped semiconductor material region 5 is disposed between the surface on which the source and drain electrodes are disposed and the channel layer 6 surrounding the gate region 4. Preferably, the relatively high resistivity region 5 is intrinsic, i.e., is neither n-type nor p-type in character, and most preferably is undoped. A gate electrode 2 is disposed on the same surface of the semiconductor body on which the source and drain electrodes 1 and 3 are disposed. Gate electrode 2 is in ohmic contact with gate region 4 and may extend, as shown in FIG. 6, beyond gate region 4 and lie partially on the relatively high resistivity region 5. Most preferably, the relatively high resistivity region 5 is gallium arsenide.

A method of manufacturing the structure of FIG. 6 is illustrated in FIGS. 7(a)-7(d). The manufacture of the JFET is begun by producing a semiconductor body having the structure shown in FIG. 7(a). The semiconductor body is formed by epitaxially growing on a gallium arsenide substrate 9, preferably a semi-insulating gallium arsenide substrate, an undoped gallium arsenide buffer layer 8. The buffer layer 8 has a thickness of about one micron. The n-type channel layer 6 is grown on the buffer layer 8 to a thickness of about 0.01 to 0.5 micron. When the channel layer 6 is gallium arsenide, it is doped to produce a carrier concentration of about $10^{17}$ to $10^{19}$ cm$^{-3}$. In an alternative embodiment of the invention, i.e, an HEMT embodiment, the channel layer 6 may be aluminum gallium arsenide having a similar thickness and similar electrical characteristics. Finally, a relatively high resistivity, undoped layer 5, preferably of gallium arsenide, is grown on the channel layer 6. Layer 5 is preferably intrinsic, i.e., of neither n-type nor p-type. Most preferably, the high resistivity layer 5 is free of dopants that could produce free or trapped electrical charges within the layer. These layers are all grown by conventional techniques, such as MBE, metal organic chemical vapor deposition (MOCVD), and the like.

Figure 7A:
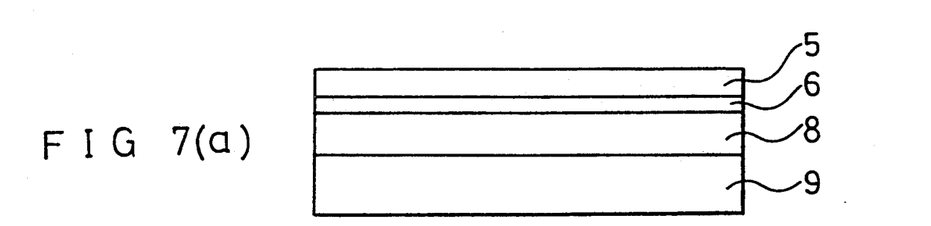
FIGS. 7(a)–7(d) are sectional views illustrating a method of making the junction field effect transistor shown in FIG. 6.
Figure 7B:
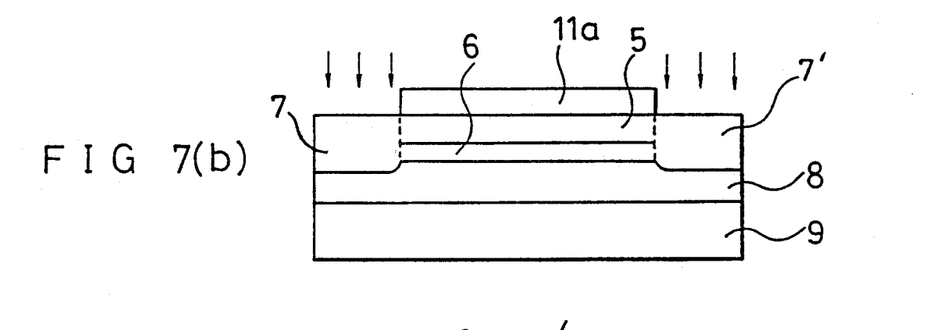

In FIG. 7(b), a photoresist layer 11a has been deposited on the relatively high resistivity layer 5 and patterned to expose two spaced apart regions. The resist film masks the central portion of the semiconductor body against ion implantation. As indicated by the arrows in FIG. 7(b), ions producing n-type conductivity are implanted in the body to form the two spaced apart n+ regions 7 and 7'. Typically, the ions implanted are silicon at an energy of 175 KeV and a dosage of $2\times10^{12}$ ion cm$^{-2}$. The ions preferably penetrate the high resistivity layer 5, the channel layer 6, and into the buffer layer 8 to form n+ regions 7 and 7'. When the channel layer 6 is aluminum gallium arsenide and the layer 5 is gallium arsenide, i.e., in the HEMT embodiment, n+ regions 7 and 7' are partially aluminum gallium arsenide and partially gallium arsenide. After the ion implantation, an annealing step at 750° C. for about 15 minutes activates the implanted ions to complete the production of the n+ regions 7 a and 7'.

Figure 7C:
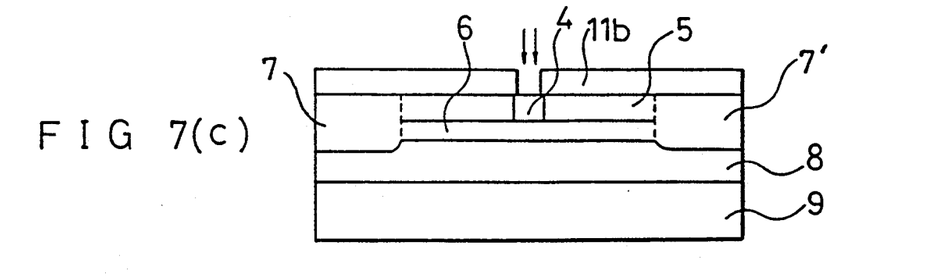

Thereafter, as illustrated in FIG. 7(c), the photoresist mask 11a is removed and a new photoresist mask 11b is formed in its place. Mask 11b includes an aperture that is centrally disposed relative to the n+ regions 7 and 7'. Mask 11b is used as an ion implantation mask and ions producing p-type conductivity in the relatively high resistance layer 5 are implanted through the aperture in the mask. Typically, magnesium ions are implanted at an energy of 120 KeV and a dosage of $1\times10^{12}$ ions cm$^{-2}$. After the ion implantation, the structure is annealed at 800° C. for 30 minutes to activate the p-type impurities and form the p-type gate region 4.

Figure 7D:
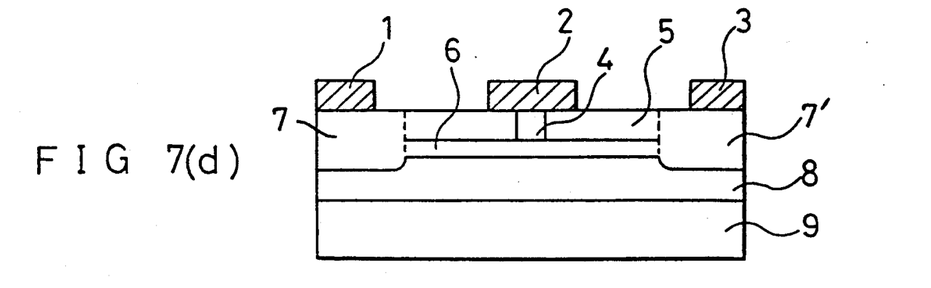

In the final steps illustrated in FIG. 7(d), the photoresist mask 11b has been removed and source and drain electrodes 1 and 3 have been deposited on the surface of the semiconductor body on the respective n+ regions 7 and 7'. In addition, a gate electrode 2 has been deposited on the same surface of the semiconductor body as the source and drain electrodes but in contact with the gate region 4. Preferably, the gate electrode 2 extends on the surface beyond gate region 4 to reduce the resistance of the gate. Since the layer 5 has a relatively high resistivity or is intrinsic, there are no adverse effects of extending the gate electrode. These ohmic contact electrodes may typically include three layers, AuGe/Ni/Au, with AuGe in contact with the semiconductor body.

The junction field effect transistor of FIG. 6 has superior characteristics both in terms of the consistency of its electrical characteristics when manufactured at different times and in its high frequency performance as compared to the conventional junction field effect transistor structures of FIGS. 1 and 3.

Figures 8A, 8B:
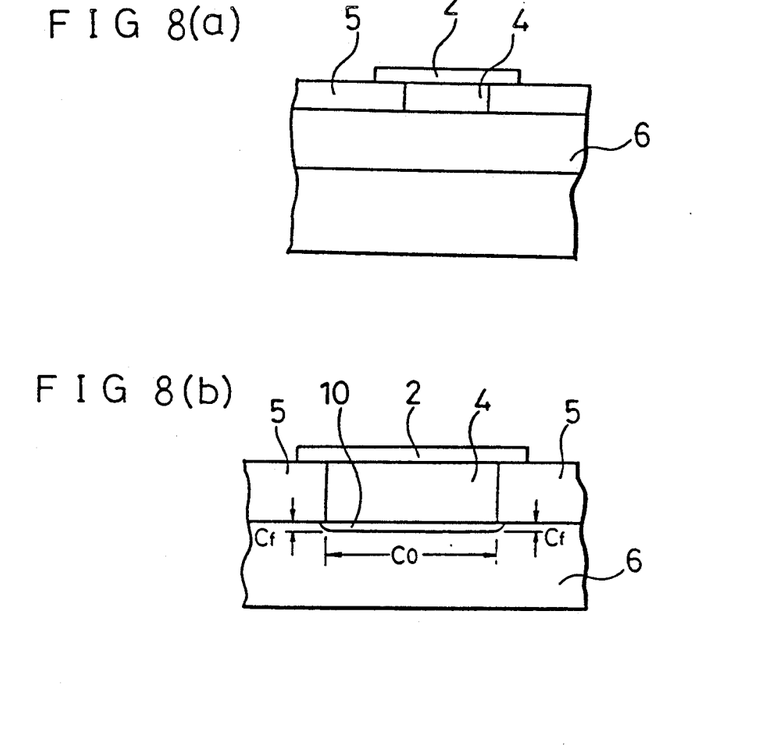
FIGS. 8(a) and 8(b) are sectional detail views of a portion of the junction field effect transistor of FIG. 6.
Figure 9:
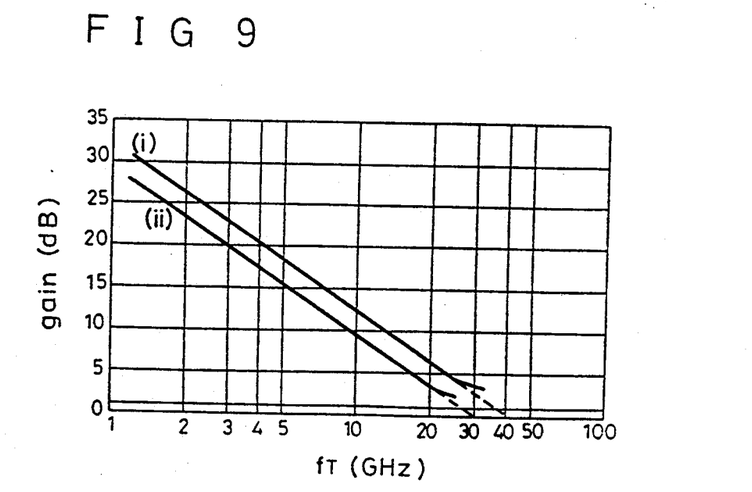
FIG. 9 is a graph of the gain as a function of frequency of a junction field effect transistor according to the invention and of a prior art junction field effect transistor.

In FIGS. 8(a) and 8(b), the gate region of a JFET according to the invention is shown in detail. As indicated in FIG. 8(b), the depletion region at the pn junction is formed essentially entirely within the channel layer 6. Thus, the gate-to-source capacitance $C_{gs}$ equals $C_o$ since the transverse components $C_f$ are negligible. The reduced capacitance increases the cutoff frequency $f_T$ of the novel JFET to approximately 42 GHz in a structure having dimensions similar to that of the example described with regard to FIG. 5. The calculated frequency response characteristic for the novel JFET transistor is shown in FIG. 9 as curve (i) whereas the calculated frequency response of the JFET example described with respect to FIG. 5 is shown by the curve (ii) in FIG. 9. The improved, i.e., extended, high frequency performance is readily apparent from FIG. 9.

Since the novel JFET employs an easily controlled ion implantation process in the formation of the gate region, devices manufactured at different times have very similar or nearly identical electrical characteristics. In other words, the JFET according to the invention provides the advantage of the prior art structure of FIG. 3 of manufacturing uniformity while also achieving the advantage of extended high frequency performance of the prior art structure of FIG. 1. The simple structure of the novel JFET is easily produced without excessive cost. The high resistivity layer 5 not only permits controlled formation of the gate region 4 but also protects the channel layer 6. When the channel layer 6 is aluminum gallium arsenide rather than gallium arsenide, i.e., in the high electron mobility transistor embodiment, even better high frequency performance is achieved.

Although the method of manufacturing the novel JFET has been described as employing ion implantation, the source and drain regions 7 and 7' and/or the gate region 4 may be formed by diffusing impurities that produce the desired conductivity type. The ion implantation technique of forming the gate region 4 preferably employs magnesium as the dopant. However, zinc can be implanted or diffused into the relatively high resistivity layer 5 to form the gate region 4. The depth of the impurities forming gate region 4 is more easily controlled by the preferred ion implantation process than in a diffusion.

An important feature of the invention is the formation of gate region 4 within a relatively high resistivity layer 5. If the region of layer 5 outside gate region 4 were not a semiconductor, the advantages of the invention would not be achieved. For example, if layer 5 outside region 4 were a dielectric, such as silicon dioxide, silicon nitride, or SiON disposed on channel layer 6, surface and interface states and carrier traps would be present and interfere with field effect transistor operation. Moreover, the differences in coefficients of thermal expansion would produce stresses adversely affecting electrical performance. In addition, to form the region for depositing such a dielectric region, channel layer 6 would have to be etched, introducing the non-uniformity problems experienced with the structure of FIG. 1 and exposing channel layer 6 to the ambient. That exposure is particularly undesirable in an HEMT when channel layer 6 is aluminum gallium arsenide since an oxide layer would be formed.

Most preferably, the rectifying junction between the gate region 4 and channel layer 6 is disposed precisely at the interface of the high resistivity layer and the channel layer 6. However, deviations from that precise positioning can be tolerated without significant increases in gate-to-source capacitance and consequent reductions in frequency response. To achieve the desired extended frequency response, the semiconductor materials employed in the novel JFET must be compound semiconductors, like gallium arsenide. However, the JFET could also be made from silicon for lower frequency response applications. While the JFET structure has been described as including a buffer layer 8 isolating the channel layer 6 from the substrate 9 and providing a better surface than the substrate for growth of the channel layer, the buffer layer is not essential to the JFET structure.

We claim:

1. A method of making a junction field effect transistor comprising:

sequentially growing a first conductivity type semiconductor layer and a relatively high resistivity semiconductor layer on a relatively high resistivity semiconductor substrate, leaving a surface of the relatively high resistivity layer exposed;

forming spaced apart relatively low resistivity first conductivity type source and drain regions in the relatively high resistivity and first conductivity type semiconductor layers;

forming a second conductivity type gate region in the high resistivity semiconductor layer spaced from the source and drain regions and extending to and forming a rectifying junction with the first conductivity type semiconductor layer; and forming spaced apart source, gate, and drain electrodes on the surface in contact with the source, gate, and drain regions, respectively, wherein the gate electrode extends beyond the gate region and contacts the relatively high resistivity semiconductor layer on the surface.

2. The method of claim 1 including growing the relatively high resistivity semiconductor layer without intentionally doping it.

3. The method of claim 1 including growing the first conductivity type semiconductor layer of a first semiconductor material and growing the relatively high resistivity semiconductor layer of a second semiconductor material.

4. The method of claim 3 including growing aluminum gallium arsenide as the first conductivity type semiconductor layer and gallium arsenide as the relatively high resistivity semiconductor layer.

5. The method of claim 3 including growing gallium arsenide as the first conductivity type semiconductor layer and gallium arsenide as the relatively high resistivity semiconductor layer.

6. The method of claim 1 including forming the source and drain regions by implanting impurities that produce the first conductivity type in two spaced apart portions of the first conductivity layer and the relatively high resistivity semiconductor layer.

7. The method of claim 6 including growing at least one of gallium arsenide and aluminum gallium arsenide as the first conductivity type semiconductor layer and the relatively high resistivity semiconductor layer and implanting silicon ions to form the source and drain regions.

8. The method of claim 1 including forming the second conductivity type gate region by implanting impurities that produce the second conductivity type in a portion of the high resistivity semiconductor layer.

9. The method of claim 8 including growing gallium arsenide as the relatively high resistivity layer and implanting magnesium in a portion of the relatively high resistivity semiconductor layer to produce the gate region.

10. The method of claim 8 including growing gallium arsenide as the relatively high resistivity layer and implanting zinc in a portion of the relatively high resistivity semiconductor layer to produce the gate region.

11. The method of claim 1 wherein the substrate is relatively high resistivity gallium arsenide including growing a relatively high resistivity buffer layer on the substrate and sequentially growing the first conductivity type semiconductor layer and relatively high resistivity semiconductor layer on the buffer layer.

12. The method of claim 11 including growing gallium arsenide as the buffer layer.

13. The method of claim 1 including forming the second conductivity gate region by diffusing impurities that produce the second conductivity type into a portion of the relatively high resistivity semiconductor layer.

14. The method of claim 1 including forming the source and drain regions by diffusing impurities that produce the first conductivity type into two spaced apart portions of the first conductivity type semiconductor layer and the relatively high resistivity semiconductor layer.

* * * * *

UNITED STATES PATENT AND TRADEMARK OFFICE
CERTIFICATE OF CORRECTION

PATENT NO. : 5,242,846

DATED : September 7, 1993

INVENTOR(S) : Izumi et al.

It is certified that error appears in the above-indentified patent and that said Letters Patent is hereby corrected as shown below:

On title page, item [75], change "Nagahara" to --Nagahama--.

Signed and Sealed this

Twelfth Day of April, 1994

Attest:

BRUCE LEHMAN

*Attesting Officer*  *Commissioner of Patents and Trademarks*